United States Patent [19]

Sasaki

[11] Patent Number: 6,027,991
[45] Date of Patent: Feb. 22, 2000

[54] METHOD OF MAKING A SILICIDE SEMICONDUCTOR DEVICE WITH JUNCTION BREAKDOWN PREVENTION

[75] Inventor: Masakazu Sasaki, Tokyo, Japan

[73] Assignee: NEC Corporation, Tokyo, Japan

[21] Appl. No.: 08/934,560

[22] Filed: Sep. 22, 1997

Related U.S. Application Data

[62] Division of application No. 08/535,400, Sep. 28, 1995, Pat. No. 5,701,029.

[30] Foreign Application Priority Data

Sep. 28, 1994 [JP] Japan ................................. 6-258858

[51] Int. Cl.[7] .................................................. H01L 21/22
[52] U.S. Cl. .................... 438/561; 438/564; 438/586; 438/596; 438/597; 438/639; 438/642
[58] Field of Search .................................. 438/564, 561, 438/586, 596, 597, 639, 642

[56] References Cited

U.S. PATENT DOCUMENTS

| | | | |
|---|---|---|---|
| 4,507,171 | 3/1985 | Bhatia et al. | 156/643 |
| 4,583,106 | 4/1986 | Anantha et al. | 257/588 |
| 4,691,435 | 9/1987 | Anantha et al. | 437/175 |
| 4,975,381 | 12/1990 | Taka et al. | 257/756 |
| 4,994,400 | 2/1991 | Yamaguchi et al. | 437/31 |
| 5,026,663 | 6/1991 | Zdebel et al. | 437/160 |
| 5,137,840 | 8/1992 | Desilets et al. | 257/588 |
| 5,147,809 | 9/1992 | Won et al. | 437/31 |
| 5,213,989 | 5/1993 | Fitch et al. | 437/31 |
| 5,670,417 | 9/1997 | Lambson et al. | 437/162 |

FOREIGN PATENT DOCUMENTS

| | | |
|---|---|---|
| 0 409 370 | 1/1991 | European Pat. Off. . |
| 6-208968 | 7/1994 | Japan . |

OTHER PUBLICATIONS

T. Nakamura et al., "Ultra High Speed Bipolar Device–SICOS", 18th International Conference on Solid State Devices and Materials pp. 279–282 (1986).

C. Chang, "Formation of PtSi in the presence of W and Al", J. Appl. Physics 63(1): 236–238 (1988).

Y. Okita et al., "A Novel Base–emitter Self–alignment Process for High Speed Bipolar LSIS", Proc. of the IEEE 1988 Custom Integrated Circuits Conference pp. 22.4.1–22.4.4 (1988).

P. Zdebel et al., "MOSAIC III—A High Performance Bioplar Technology with Advanced Self–aligned Devices", Proc. of the 1987 Bipolar Circuits and Technology Meeting pp. 172–175 (1987).

H. Miyanaga et al., "A 0.85 ns 1Kb Bipolar ECL RAM", 16th Conference on Solid State Devices and Materials, pp. 225–228 (1984).

*Primary Examiner*—Jey Tsai
*Assistant Examiner*—Lynne A. Gurley
*Attorney, Agent, or Firm*—Foley & Lardner

[57] ABSTRACT

A method of making a semiconductor device includes a semiconductor substrate, an impurity doped region formed in the semiconductor substrate, an insulating layer formed on the semiconductor substrate having an opening leading to the impurity doped region, a polycrystalline silicon layer formed on the insulating layer and the impurity doped region, and a metal silicide layer formed on the polycrystalline silicon layer. A transverse thickness of the polycrystalline silicon layer at a sidewall of the insulating layer is larger than a longitudinal thickness of the polycrystalline silicon layer at a bottom of the opening and at a surface of the insulating layer.

6 Claims, 11 Drawing Sheets

METHOD OF MAKING A SILICIDE SEMICONDUCTOR DEVICE WITH JUNCTION BREAKDOWN PREVENTION

This application is a division of application Ser. No. 08/535,400, filed Sep. 28, 1995 now U.S. Pat. No. 5,701,029.

BACKGROUND OF THE INVENTION

1. Field of the Invention

The present invention relates to a silicide semiconductor device having a polycrystalline silicon layer sandwiched between a semiconductor substrate and a metal silicide layer.

2. Description of the Related Art

Generally, in a semiconductor device, a metal layer made of aluminum, for example, is deposited as an electrode on a semiconductor substrate made of silicon. In this case, when a heat process is carried out, the metal layer reacts on the semiconductor substrate to form a metal silicide layer. If a shallow PN junction is formed in the semiconductor substrate in advance, metal is immersed through the PN junction, so that the PN junction is broken down which invites electrical leakage.

In a prior art semiconductor device, in order to avoid the above-described electrical leakage caused by the breakdown of the PN junction, a polycrystalline silicon layer serving as an impurity diffusion source is interposed between the metal layer and the semiconductor substrate. That is, an insulating layer is formed on the semiconductor substrate, and an opening is perforated in the insulating layer. Then, a polycrystalline silicon layer is deposited on the semiconductor substrate through the opening of the insulating layer. In this case, impurity ions are doped into the polycrystalline silicon layer, and thereafter, a heat operation is performed upon the polycrystalline silicon layer, so that an inpurity doped region is formed in the semiconductor substrate. Thus, a shallow PN junction is formed within the semiconductor substrate.

Even in the above-described prior art semiconductor device. however, if the thickness of the insulating layer is too large, it is impossible to avoid breakdown of PN junctions due to the immersion of metal into the semiconductor substrate. This will be explained later in detail.

SUMMARY OF THE INVENTION

It is an object of the present invention to avoid breakdown of PN junctions due to the immersion of metal into a semiconductor substrate.

According to the present invention, in a semiconductor device including a semiconductor substrate, an impurity doped region formed in the semiconductor substrate, an insulating layer formed on the semiconductor substrate and having an opening leading to the impurity doped region, a polycrystalline silicon layer formed on the insulating layer and the impurity doped region, and a metal silicide layer formed on the polycrystalline silicon layer, a transverse thickness of the polycrystalline silicon layer at a sidewall of the insulating layer is larger than a longitudinal thickness of the polycrystalline silicon layer at a bottom of the opening and at a surface of the insulating layer.

Also, in the present invention, the polycrystalline silicon layer has a larger crystal grain size at a sidewall of the insulating layer than at a bottom of the opening and at a surface of the insulating layer.

Thus, the immersion of metal into the semiconductor substrate is stopped by the thicker portion of the polycrystalline silicon or by the larger crystal grain size portion of the polycrystalline silicon layer, to avoid the breakdown of the PN junction within the semiconductor substrate.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art method for manufacturing a semiconductor device having a polycrystalline silicon layer sandwiched by a semiconductor substrate and a metal silicide layer will be explained with reference to FIGS. 1A through 1D. Note that FIGS. 1A through 1D show a method for manufacturing an NPN type transistor.

Figure 1A:
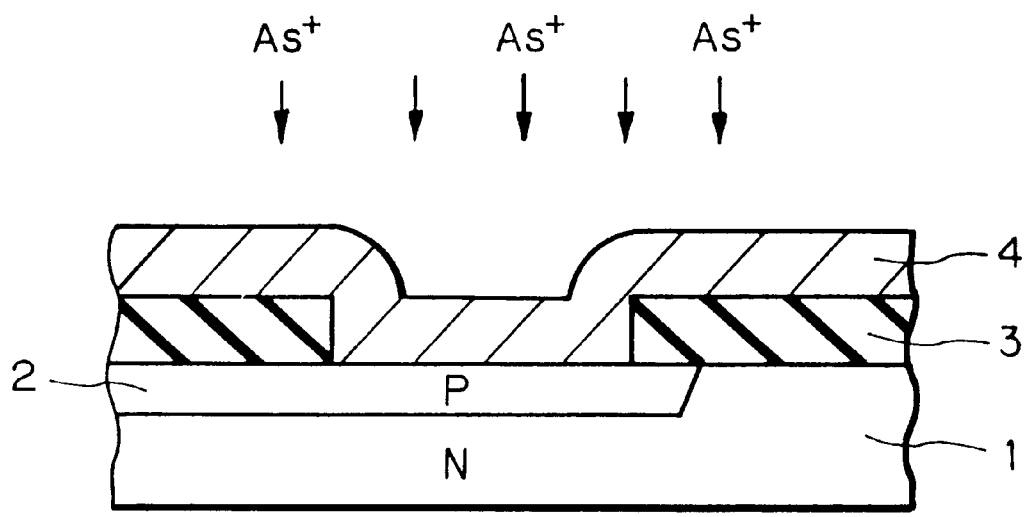
FIGS. 1A through 1D are cross-sectional views illustrating a prior art method for manufacturing a semiconductor device.

First, referring to FIG. 1A, a base P-type impurity diffusion region 2 is selectively formed in an N-type silicon substrate 1. Also, an insulating layer 3 made of silicon oxide is formed on the silicon substrate 1, and an opening is perforated in the insulating layer 3. Then, a polycrystalline silicon layer 4 is deposited by a chemical vapor deposition (CVD) process, and N-type impurity ions such as arsenic ions are doped thereinto. Thus, a high concentration N-type polycrystalline silicon layer, which serves as a diffusion source for an emitter impurity diffusion region, is obtained.

Figure 1B:
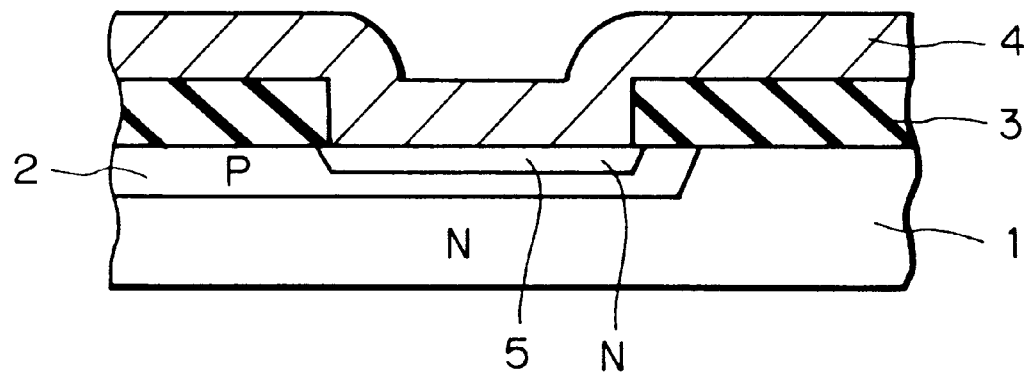

Next, referring to FIG. 1B, a heating operation or an annealling operation is carried out in a nitrogen atmosphere to diffuse the arsenic from the polycrystalline silicon layer 4 into the silicon substrate 1. As a result, an emitter N-type impurity diffusion region 5 is formed in the base P-type impurity diffusion region 2. Thus, a shallow PN junction is created in the silicon substrate 1.

Figure 1C:
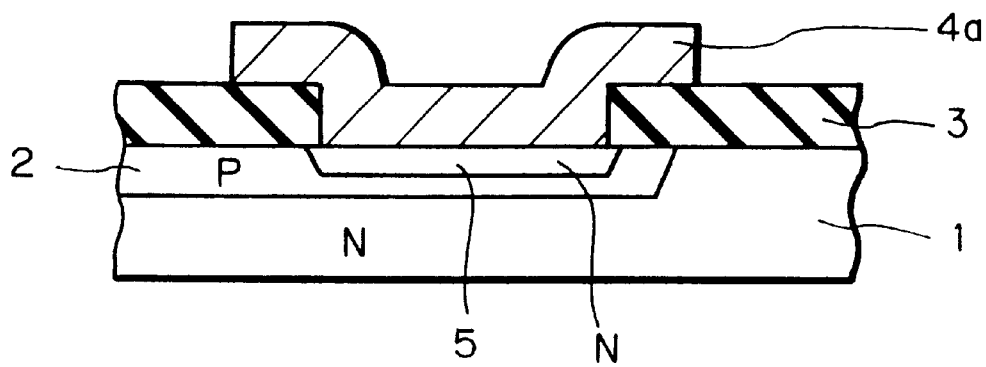

Next, referring to FIG. 1C, the polycrystalline silicon layer 4 is patterned by a photolithography process to obtain an emitter electrode 4a.

Figure 1D:
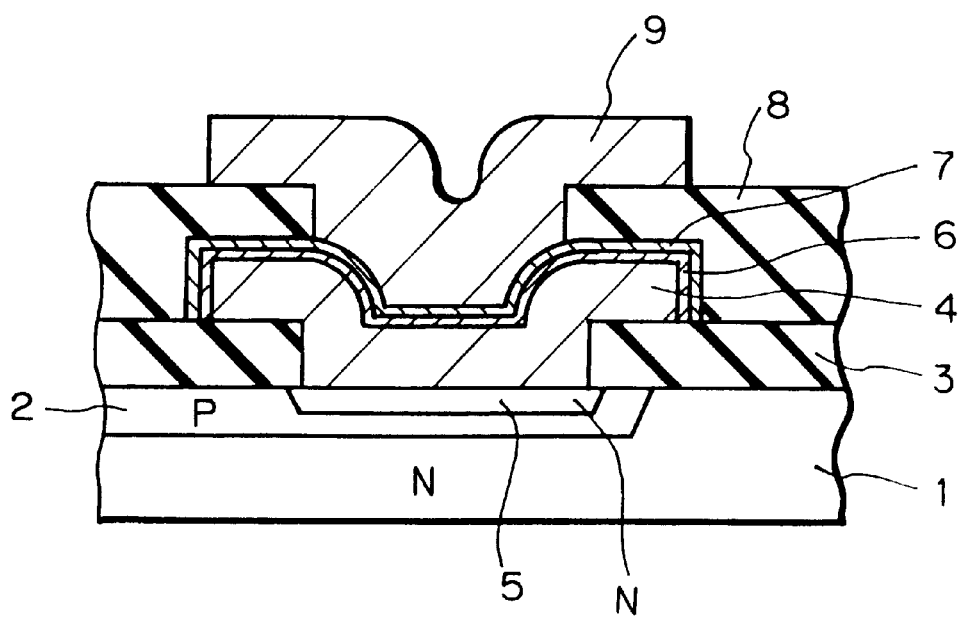

Finally, referring to FIG. 1D, a platinum layer is formed by a sputtering process, and a heating operation is carried out under a nitrogen atmosphere. As a result, the platinum layer reacts on the upper portion of the polycrystalline silicon layer 4 to thereby form a platinum silicide layer 6. Also, a high melting point metal layer 7 made of tungsten, titanium or molybdenum is deposited by a sputtering process thereon. Further, insulating layer 8 is formed, and an opening is perforated therein. Then, an electrode layer 9 made of aluminum is deposited and patterned, thus completing a semiconductor device.

In the semiconductor device as illustrated in FIGS. 1A through 1D, if the insulating layer 3 is thick, for example, 500 to 700 nm thick, the shallow PN junction may be broken down.

Figure 2A:
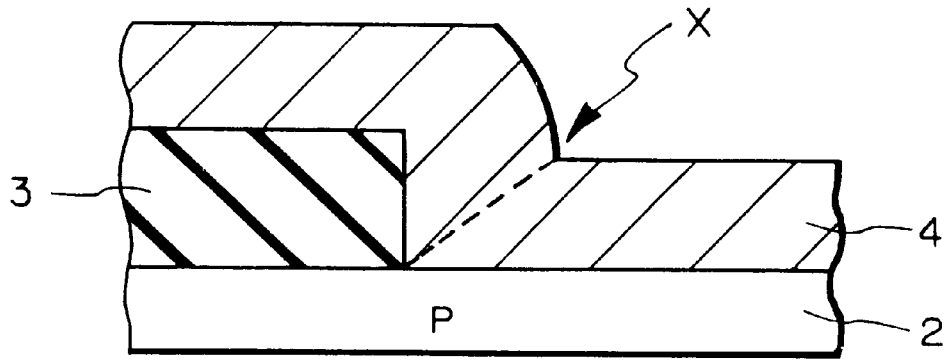
FIGS. 2A and 2B are cross-sectional views for explaining the breakdown of a PN junction in the device of FIGS. 1A through 1D.

That is, as illustrated in FIG. 2A, which is a partial enlargement of FIG. 1B, although the polycrystalline silicon layer 4 is homogeneously grown, polycrystalline silicon grown along a transverse direction collides with polycrystalline silicon grown along a longitudinal direction, so that the crystal grain size of polycrystalline silicon around the sidewall of the insulating layer 3 as indicated by X becomes smaller than the other portions thereof.

Figure 2B:
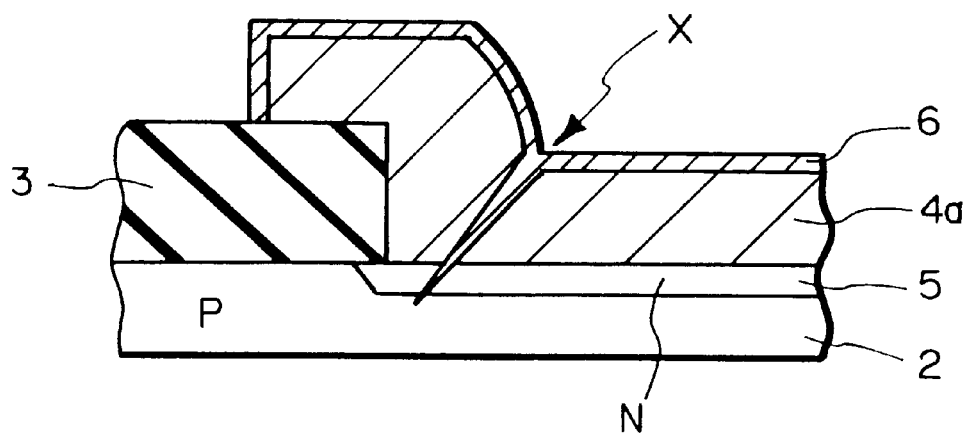

As a result, as illustrated in FIG. 2B, which is a partial enlargement of FIG. 1D, the metal, i.e., platinum of the silicide layer 6 is immersed through the smaller crystal grain size portion X into the PN junction of the silicon substrate 1. As a result, the PN junction is broken down.

Incidentally, the depth of immersed metal in the polycrystalline silicon layer 4 is about 300 to 400 nm. Therefore, if the polycrystalline silicon layer 4 is about 500 nm or more thick, the metal hardly reaches the silicon substrate 1. However, the thick polycrystalline silicon layer creates a step in the laminated configuration including the insulating layer 8 and the electrode layer 9, thus inviting disconnections of the electrode layer 9. This reduces the manufacturing yield of semiconductor devices. Thus, it is disadvantageous to thicken the polycrystalline silicon layer 4.

FIGS. 3A through 3E are cross-sectional views for explaining a first embodiment of the method for manufacturing a semiconductor device according to the present invention.

Figure 3A:
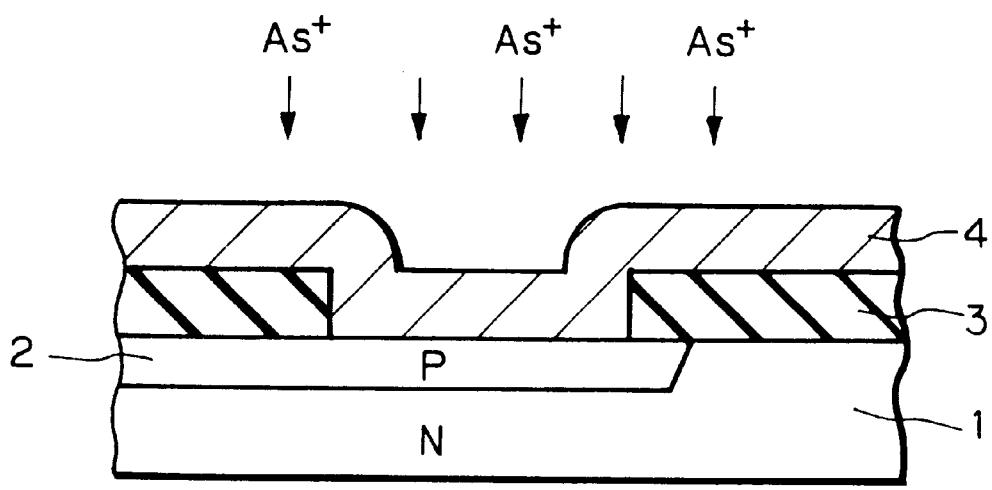
FIGS. 3A through 3E are cross-sectional views illustrating a first embodiment of the method for manufacturing a semiconductor device according to the present invention.

First, referring to FIG. 3A, in the same way as in FIG. 1A, a base P-type impurity diffusion region 2 is selectively formed in an N-type silicon substrate 1. Also, an insulating layer 3 made of silicon oxide is formed on the silicon substrate 1, and an opening is perforated in the insulating layer 3. Then, an about 500 nm thick polycrystalline silicon layer 4 is deposited by a CVD process, and N-type impurity ions such as arsenic ions are doped thereinto. Thus, a high concentration N-type polycrystalline silicon layer, which serves as a diffusion source for an emitter impurity diffusion region, is obtained.

Figure 3B:
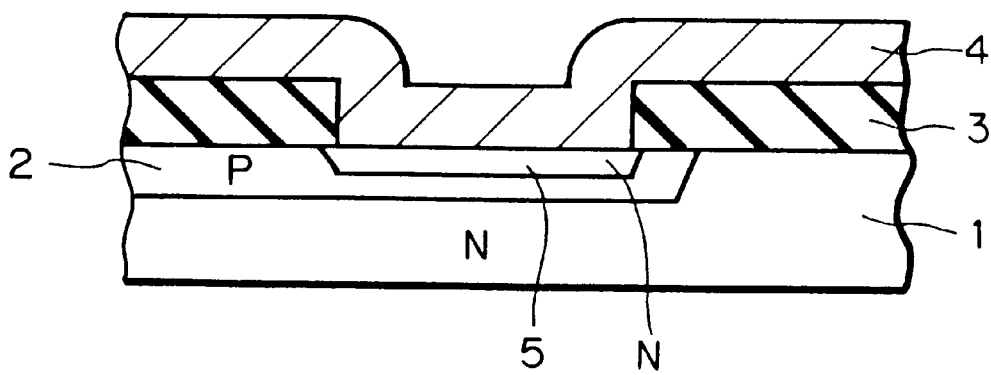

Next, referring to FIG. 3B, in the same way as in FIG. 1B, a heating operation or an annealling operation is carried out in a nitrogen atmosphere to diffuse the arsenic from the polycrystalline silicon layer 4 into the silicon substrate 1. As a result, an emitter N-type impurity diffusion region 5 is formed in the base P-type impurity diffusion region 2. Thus, a shallow PN junction is created in the silicon substrate 1.

Figure 3C:
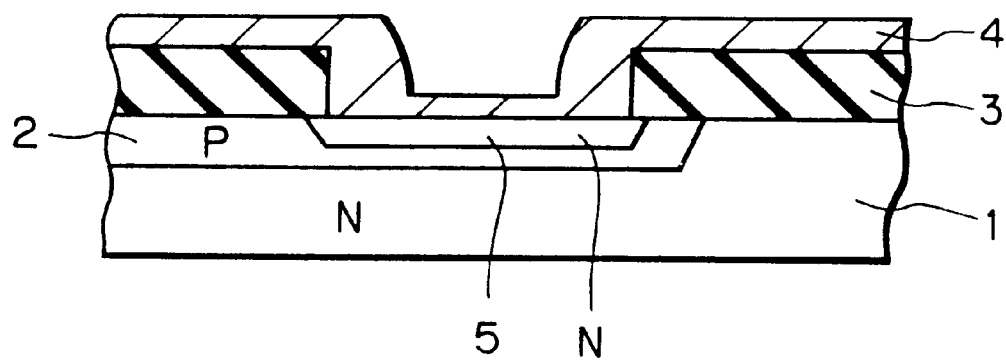

Next, referring to FIG. 3C, the polycrystalline silicon layer 4 is etched back by an anisotropic etching process. As a result, the thickness of the polycrystalline silicon 4 around the sidewall of the insulating layer 3 is still about 500 nm, while the thickness of the polycrystalline silicon layer 4 on the surface of the insulating layer 3 and the bottom of the opening thereof is about 200 nm.

Figure 3D:
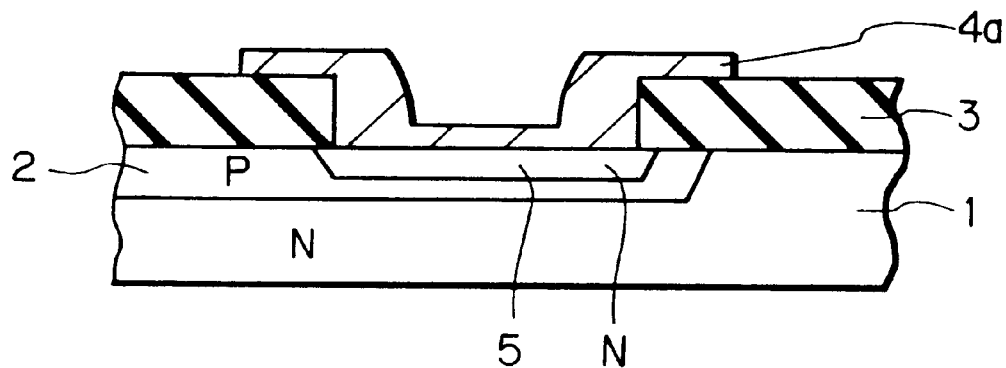

Next, referring to FIG. 3D, in the same way as in FIG. 1C, the polycrystalline silicon layer 4 is patterned by a photolithography process to obtain an emitter electrode 4a.

Figure 3E:
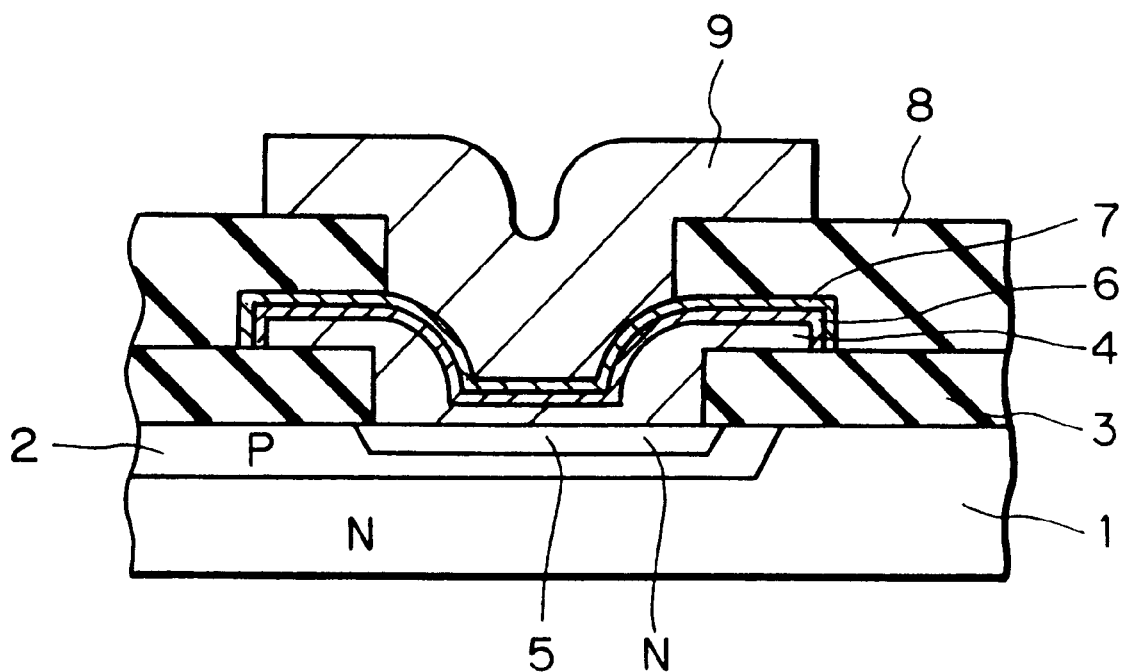

Finally, referring to FIG. 3E, in the same way as in FIG. 1D, a platinum layer is formed by a sputtering process, and a heating operation is carried out at a temperature of about 400° C. under a nitrogen atmosphere. As a result, the platinum layer reacts on the upper portion of the polycrystalline silicon layer 4 to thereby form a platinum silicide layer 6. Also, a high melting point metal layer 7 made of tungsten, titanium or molybdenum is deposited by a sputtering process thereon. Further, insulating layer 8 is formed, and an opening is perforated therein. Then, an electrode layer 9 made of aluminum is deposited and patterned, thus completing a semiconductor device.

In the semiconductor device as illustrated in FIGS. 3A through 3E, if the insulating layer 3 is thick, for example, 500 to 700 nm thick, the shallow PN junction may not be broken down.

Figure 4A:
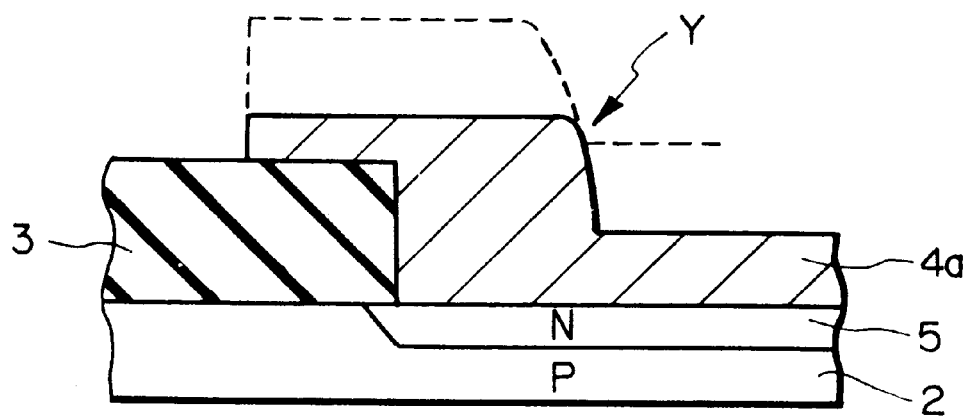
FIGS. 4A and 4B are cross-sectional views for explaining the breakdown of a PN junction in the device of FIGS. 3A through 3E.

That is, as illustrated in FIG. 4A, which is a partial enlargement of FIG. 3D, although the crystal grain size of polycrystalline silicon around the sidewall of the insulating layer 3 as indicated by Y becomes smaller than the other portions thereof, the thickness of the portion of the polycrystalline silicon layer 4a as indicated by Y is still thick, for example, about 500 nm.

Figure 4B:
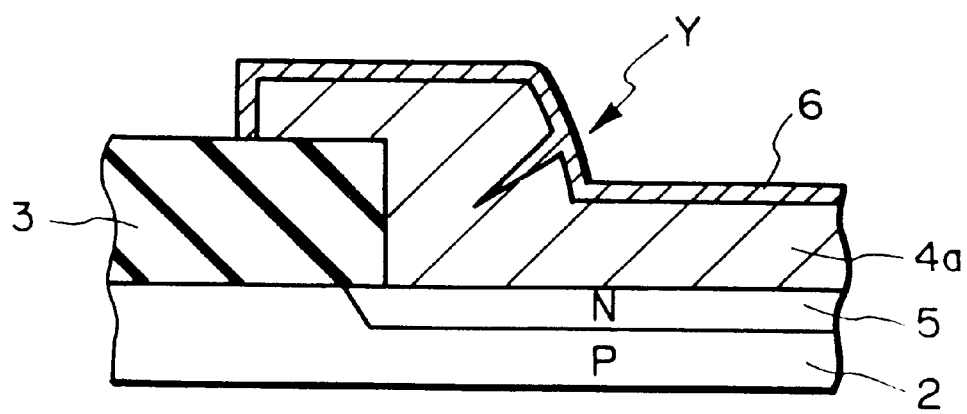

As a result, as illustrated in FIG. 4B, which is a partial enlargement of FIG. 3E, even when the metal, i.e., platinum of the silicide layer 6 is immersed through the smaller crystal grain size portion Y, the metal cannot reach the PN junction of the silicon substrate 1. As a result, the PN junction is not broken down.

FIGS. 5A through 5F are cross-sectional views for explaining a second embodiment of the method for manufacturing a semiconductor device according to the present invention.

Figure 5A:
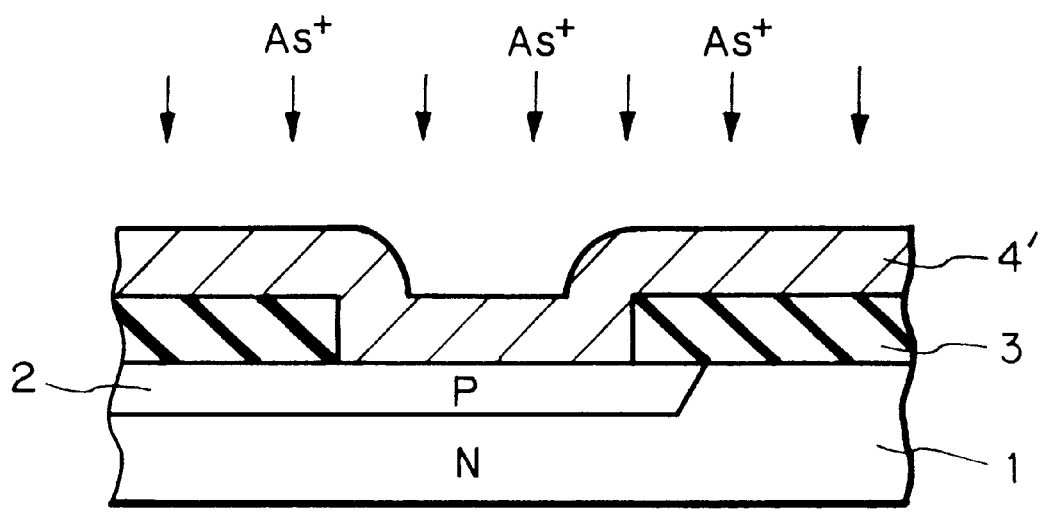
FIGS. 5A through 5F are cross-sectional views illustrating a second embodiment of the method for manufacturing a semiconductor device according to the present invention.

First, referring to FIG. 5A, in a similar way to that shown in FIG. 1A, a base P-type impurity diffusion region 2 is selectively formed in an N-type silicon substrate 1. Also, an insulating layer 3 made of silicon oxide is formed on the silicon substrate 1, and an opening is perforated in the insulating layer 3. Then, an about 100 to 200 nm thick polycrystalline silicon layer 4' is deposited by a CVD process, and N-type impurity ions such as arsenic ions are doped thereinto.

Figure 5B:
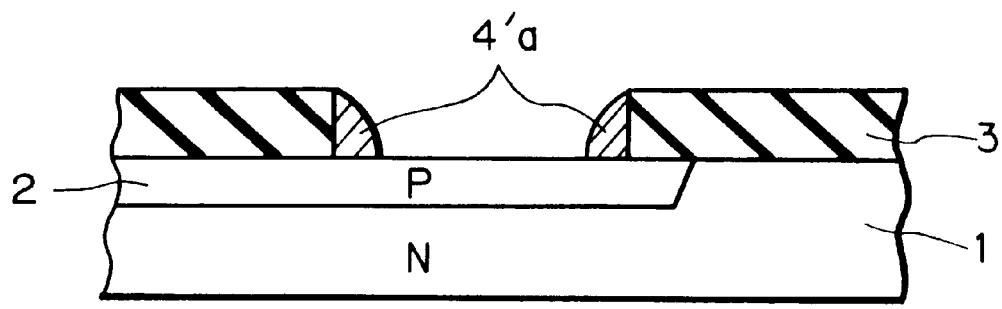

Next, referring to FIG. 5B, the polycrystalline silicon layer 4' is etched back by an anisotropic etching process, to leave a sidewall polycrystalline silicon layer 4'a on the sidewall of the insulating layer 3. Then, a heating operation is performed upon the sidewall polycrystalline silicon layer 4'a at a temperature of about 900 to 1000° C. under a nitrogen atmosphere, to increase the crystal grain size of the sidewall polycrystalline silicon layer 4'a.

Figure 5C:
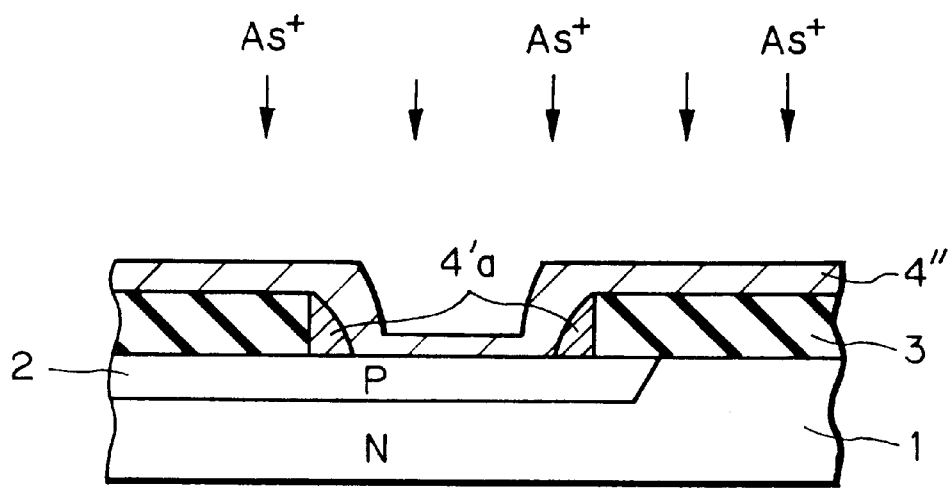

Next, referring to FIG. 5C, another polycrystalline silicon layer 4" is deposited by a CVD process, and N-type impurity ions such as arsenic ions are doped thereinto. In this case, note that the portion of the polycrystalline silicon layer 4" on the sidewall polycrystalline silicon layer 4'a also has a large crystal grain size, since this portion has the same crystal structure as the sidewall polycrystalline silicon layer 4'a.

Thus, a high concentration N-type polycrystalline silicon layer, which serves as a diffusion source for an emitter impurity diffusion region, is obtained.

Figure 5D:
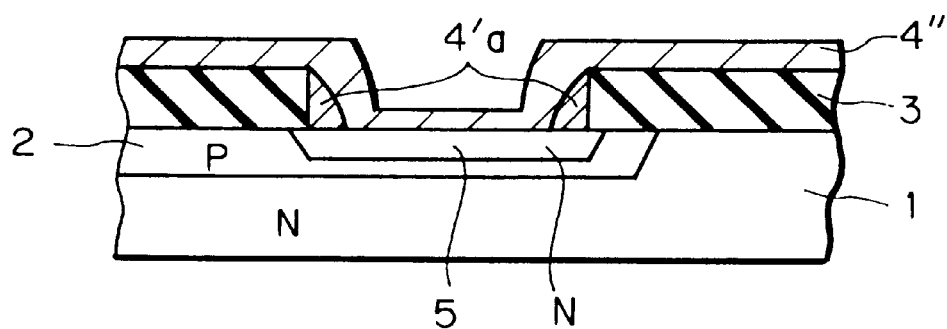

Next. referring to FIG. 5D, in a similar way to that as shown in FIG. 1B, a heating operation or an annealling operation is carried out in a nitrogen atmosphere to diffuse the arsenic from the polycrystalline silicon layers 4'a and 4" into the silicon substrate 1. As a result, an emitter N-type impurity diffusion region 5 is formed in the base P-type impurity diffusion region 2. Thus, a shallow PN junction is created in the silicon substrate 1.

Figure 5E:
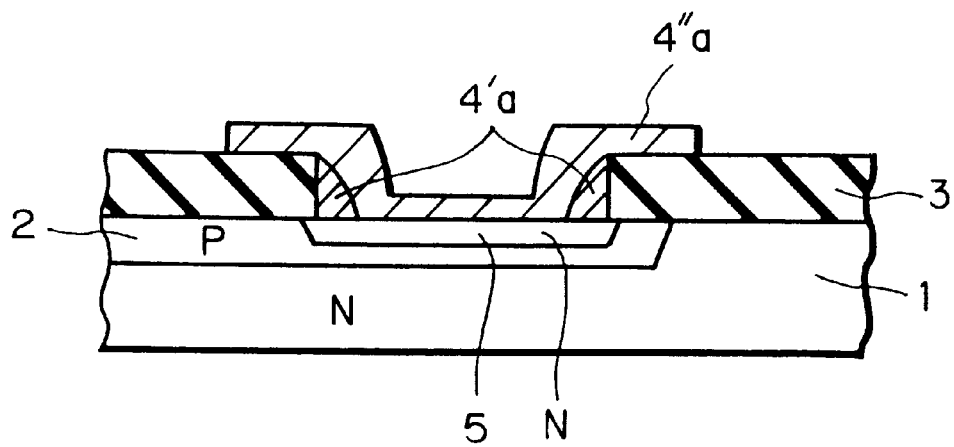

Next, referring to FIG. 5E, in a similar way to that as shown in FIG. 1C, the polycrystalline silicon layer 4" is patterned by a photolithography process to obtain an emitter electrode 4"a.

Figure 5F:
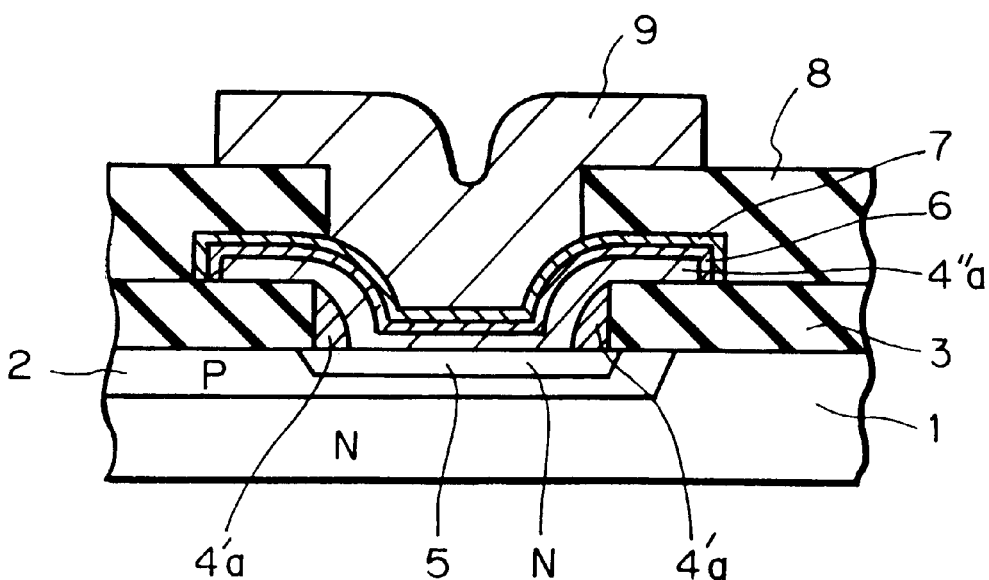

Finally, referring to FIG. 5F, in the same way as in FIG. 1D, a platinum layer is formed by a sputtering process, and a heating operation is carried out at a temperature of about 400° C. under a nitrogen atmosphere. As a result, the platinum layer reacts on the upper portion of the polycrystalline silicon layer 4 to thereby form a platinum silicide layer 6. Also, a high melting point metal layer 7 made of tungsten, titanium or molybdenum is deposited by a sputtering process thereon. Further, insulating layer 8 is formed, and an opening is perforated therein. Then, an electrode layer 9 made of aluminum is deposited and patterned, thus completing a semiconductor device.

Also, in the semiconductor device as illustrated in FIGS. 5A through 5F, if the insulating layer 3 is thick, for example, 500 to 700 nm thick, the shallow PN junction may not be broken down.

Figure 6A:
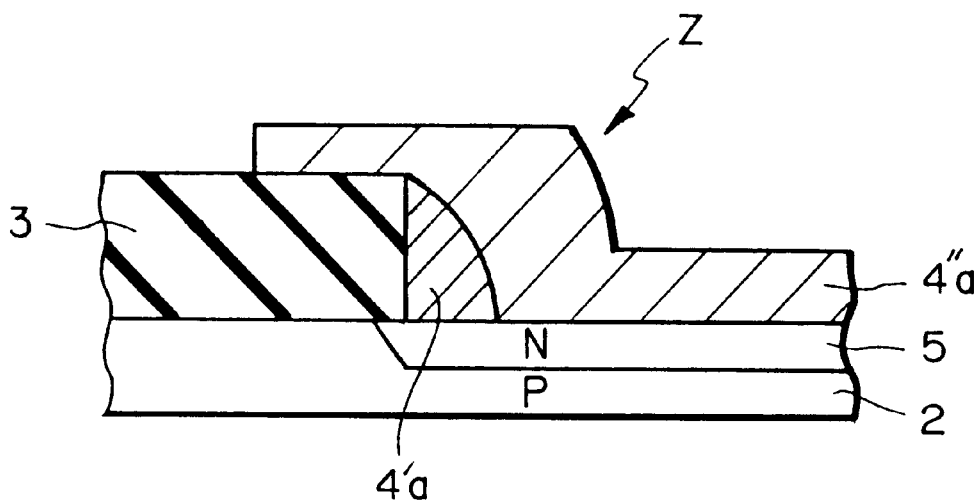
FIGS. 6A and 6B are cross-sectional views for explaining the breakdown of a PN junction in the device of FIGS. 5A through 5F.

That is, as illustrated in FIG. 6A, which is a partial enlargement of FIG. 3E, even if the thickness of the polycrystalline silicon layers 4'a and 4"a around the sidewall of the insulating layer 3 as indicated by Z is less than 500 nm, the crystal grain size of polycrystalline silicon around the sidewall of the insulating layer 3 as indicated by Z is large.

Figure 6B:
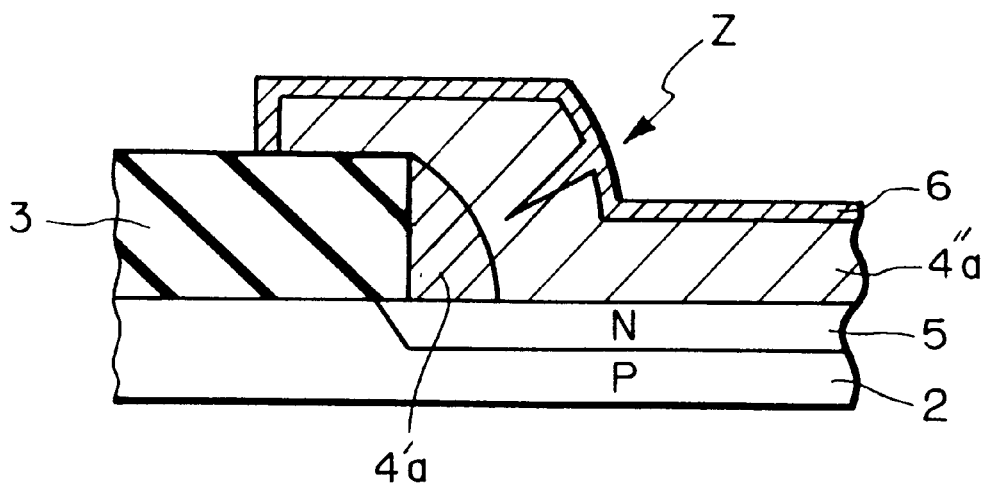

As a result, as illustrated in FIG. 6B, which is a partial enlargement of FIG. 5F, the immersion of metal, i.e., platinum into the PN junction of the silicon substrate 1 is interrupted by the larger crystal grain size polycrystalline silicon as indicated by Z. As a result, the PN junction is not broken down.

Note that a titanium silicide layer or the like can be used as the metal silicide layer instead of a platinum silicide layer. Also, the present invention can be applied to devices other than bipolar transistors.

As explained hereinbefore, according to the present invention, since the immersion of metal of silicide into a semiconductor substrate is interrupted by a thick polycrystalline silicon layer or a large crystal grain size polycrystalline silicon layer, the breakdown of PN junctions in the semiconductor substrate can be avoided.

I claim:

1. A method for manufacturing a semiconductor device, comprising the steps of:

forming an insulating layer on a semiconductor substrate;

forming an opening in said insulating layer;

forming an impurity-doped polycrystalline silicon layer on a top surface of said insulating layer, side surfaces of said insulating layer defined within said opening, and on said semiconductor substrate;

performing a heating operation upon said impurity-doped polycrystalline silicon layer to form an impurity doped region in said semiconductor substrate under said polycrystalline silicon layer;

etching back a part of said polycrystalline silicon layer by an anisotropic etching process to obtain a reduced thickness polycrystalline silicon layer said reduced thickness polysilicon layer in contact with regions of said top and side surfaces of said insulating layer and said impurity doped region and reduced in thickness throughout contact regions of said top surface of said insulating layer and said impurity doped region; and forming a metal silicide layer on said reduced thickness polycrystalline silicon layer.

2. A method as set forth in claim 1, further comprising step of forming a metal layer on said metal silicide layer.

3. A method as set forth in claim 2, further comprising a step of forming a high melting point metal layer between said metal silicide layer and said metal layer.

4. A method for manufacturing a semiconductor device, comprising the steps of:

forming an insulating layer on a semiconductor substrate having a first impurity doped region;

forming an opening in said insulating layer over said first impurity doped region;

forming a first impurity-doped polycrystalline silicon layer on said insulating layer and said first impurity doped region;

etching back said first impurity-doped polycrystalline silicon layer by an anisotropic etching process to leave said first impurity-doped polycrystalline silicon layer as a sidewall polycrystalline silicon layer on a sidewall of said insulating layer;

performing a heating operation upon said sidewall polycrystalline silicon layer to increase a crystal grain size thereof;

forming a second impurity-doped polycrystalline silicon layer in contact with said insulating layer, said sidewall polycrystalline silicon layer, and said first impurity a doped region;

performing a heating operation upon said first and second impurity-doped polycrystalline silicon layers to form a second impurity doped region in said semiconductor substrate with a mask of said insulating layer; and forming a metal silicide layer on said second impurity-doped polycrystalline silicon layer.

5. A method as set forth in claim 4, further comprising step of forming a metal layer on said metal silicide layer.

6. A method as set forth in claim 5, further comprising a step of forming a high melting point metal layer between said metal silicide layer and said metal layer.

* * * * *